United States Patent [19]
Hara et al.

[11] Patent Number: 5,220,171
[45] Date of Patent: Jun. 15, 1993

[54] WAFER HOLDING DEVICE IN AN EXPOSURE APPARATUS

[75] Inventors: Shinichi Hara, Yokohama; Eiji Sakamoto, Sagamihara; Ryuichi Ebinuma, Machida, all of Japan

[73] Assignee: Canon Kabushiki Kaisha, Tokyo, Japan

[21] Appl. No.: 786,885

[22] Filed: Nov. 1, 1991

[30] Foreign Application Priority Data

Nov. 1, 1990 [JP] Japan .................... 2-293624
Jul. 9, 1991 [JP] Japan .................... 3-168294

[51] Int. Cl.⁵ .......................... H01J 37/30
[52] U.S. Cl. .................... 250/443.1; 250/440.11; 62/259.2; 165/104.21
[58] Field of Search .............. 250/443.11, 442.11, 250/440.1, 310; 62/259.2; 165/104.21

[56] References Cited

U.S. PATENT DOCUMENTS 5,093,579 3/1992 Amemiya et al. ............. 250/441.11
5,126,571 6/1992 Sakai ........................... 250/443.1

Primary Examiner—Paul M. Dzierzynski
Assistant Examiner—Kiet T. Nguyen
Attorney, Agent, or Firm—Fitzpatrick, Cella, Harper & Scinto

[57] ABSTRACT

A substrate holding device includes a chuck having an attracting surface for holding a substrate, an inside space and an inside heat pipe structure provided in the inside space, the heat pipe structure removing generated heat by evaporation of a liquid medium; a temperature controlling block having a structure that allows flow of a temperature controlling medium therethrough, the temperature controlling block being thermally coupled to the attracting surface of the chuck through the heat pipe structure; and a stage for moving the chuck and the temperature controlling block as a unit, and for supporting the chuck through the temperature controlling block.

20 Claims, 15 Drawing Sheets

WAFER HOLDING DEVICE IN AN EXPOSURE APPARATUS

FIELD OF THE INVENTION AND RELATED ART

This invention relates to a wafer holding device for use in an exposure apparatus and, more particularly, to such a wafer holding device of the type wherein a cooling medium such as cooling water flows through a wafer chuck, which is held fixed on a stage having low rigidity, for cooling a wafer.

With increasing capacities of semiconductor memories, further improvements in refining techniques in semiconductor device manufacturing apparatuses are desired.

One measure for improving the fineness is the use of an X-ray exposure apparatus using synchrotron radiation light as a light source.

The X-ray exposure apparatus is an apparatus wherein one or more mask patterns on a reticle (mask) are projected on a wafer and, through step-and-repeat exposures, images of the mask patterns are printed in array on the whole surface of the wafer. In this type of exposure apparatus, as compared with a conventional exposure apparatus using deep ultraviolet light or the like as a light source, the wafer and the reticle are held upstanding (substantially parallel to a vertical plane) during the exposure operation.

FIG. 11 is a schematic view showing a known type wafer holding block usable in such an X-ray exposure apparatus (Japanese Laid-Open Patent Application, Laid-Open No. 2-100311).

The wafer holding block comprises a rough-motion stage 613 for effecting relatively rough alignment of a wafer to a reticle in X-axis, Y-axis and Z-axis directions as illustrated; a support table 612 fixed to the rough-motion stage 613; a fine-motion stage 605 provided at a central portion of the support table 612, for effecting fine alignment of the wafer to the reticle; and a wafer chuck 601 mounted to the fine-motion stage 605.

The wafer chuck 601 can be moved in the X-axis, Y-axis and Z-axis directions by the rough-motion stage 613 which is driven by means of actuators (not shown). Also, it can be moved in the X-axis, Y-axis and Z-axis directions as well as in rotational directions wx, wy and wz (about the X, Y and Z axes, respectively), by means of the fine-motion stage. However, for simplicity, only the fine-motion stage 605 as being movable finely in the wz direction is illustrated in FIG. 11. More specifically, the fine-motion stage 605 is supported at its four corners and at the centers of the four sides, respectively, by means of leaf springs 610. It can be moved minutely in the wz direction through a drive from a combination of a rubber 609 and a piezoelectric device 611.

The wafer chuck 601 is further equipped with a vacuum attraction groove 602 of cross shape which is communicated with a vacuum pump (not shown) through a piping means (not shown).

Also, in this X-ray exposure apparatus, since a pattern to be transferred to a wafer is very fine, the exposure operation is effected by projecting X-rays of an intensity of about 100 mW/cm$^2$. This results in non-negligible thermal distortion due to a temperature rise caused by the X-ray irradiation, and this necessitates use of a wafer cooling device for cooling the wafer during the exposure.

Examples of such a wafer cooling device may be as follows:

(a) A heat conductive material having freedom and deformability, such as a Hg material, a metal textile or a fine Cu wire, for example, is interposed between a wafer cooling device and a wafer chuck (Japanese Laid-Open Patent Applications, Laid-Open Nos. 59-117128, 61-172357 and 63-193447).

(b) A heat pipe structure wherein a wafer chuck serves as an evaporation portion is used (Japanese Laid-Open Patent Application, Laid-Open No. 63-65066).

(c) Temperature regulated cooling water flows through a wafer chuck 601, to keep the wafer chuck temperature constant (Japanese Laid-Open Patent Application, Laid-Open No. 63-98119).

However, these wafer cooling devices involve some inconveniences such as follows:

(a) In the type wherein a heat conductive material having freedom and deformability is interposed between a wafer cooling device and a wafer chuck, it is not possible to retain the flatness (e.g. not more than 1 micron in an area of 10 cm $\times$ 10 cm) necessary for correction of deformation of a wafer, and the pattern transfer precision degrades. Also, generally such a heat conductive material does not have a good heat conductivity.

(b) The heat pipe structure wherein a wafer chuck serves as an evaporation portion and wherein the heat pipe connects the wafer chuck and the condensing portion to which the cooling water is supplied, is not suitably usable in an X-ray exposure apparatus wherein the position of the wafer chuck 601 has to be adjusted, although it may be suitably used in a vacuum deposition device or the like in which the wafer chuck is held immovable.

(c) In the type wherein temperature regulated cooling water flows through a wafer chuck 601, to keep the wafer chuck temperature constant, as clearly seen from the results of experiment shown in FIG. 13, if the wafer chuck 601 is mounted to the fine-motion stage 605 which is a low rigidity stage, the displacement of a wafer attracted to and held by the wafer chuck 601 is proportional to the square of the flow rate of the cooling water (e.g. a displacement of about 0.20 micron occurs as the cooling water flows at a rate of 4.0 m/sec, whereas a displacement of about 0.05 micron occurs as the flow rate of the cooling water is decreased to one half (2.0 m/sec)). Thus, the flow rate of the cooling water has to be decreased as much as possible. However, in order to avoid a temperature rise at the attracting surface of the wafer chuck (the surface to which the wafer is attracted), generally seven cooling water flow passageways 604$_1$–604$_7$ may be provided in the neighborhood of the attracting surface, to thereby shorten the distance between the attracting surface and the cooling surface (the surface of each of the cooling water flowing passageways 604$_1$–604$_7$ at the attracting surface side). However, if the distance is short, the diffusion of temperature to the X-Y plane illustrated is made smaller, and therefore the heat flow density at the cooling surface becomes substantially equal to that flowing into the attracting surface. Thus, for prevention of temperature rise, a large quantity of cooling water has to flow through the cooling water passageways 604$_1$–604$_7$, and this causes a problem of degraded pattern transfer precision due to the wafer displacement.

Japanese Laid-Open Patent Application, Laid-Open No. 2-183514 shows a temperature adjusting mechanism for a wafer chuck. In this mechanism, for a good responsibility of temperature control as compared with the cooling by using cooling water, a temperature sensor is disposed within the wafer chuck, while a Peltier device is mounted to the wafer chuck and it is controlled in response to a detection signal from the temperature sensor.

FIG. 14 shows an example of a structure of a wafer chuck using such a Peltier device. In this example, an attracting block 701 for holding a wafer is mounted to a stage 708 through the intervention of a Peltier device 704 and a cooling block 706, in this order. Grooves 702 are formed in the attracting surface of the attracting block 701 which has formed therein vacuum attraction piping means 703 communicated with these grooves. Temperature sensor 719 is mounted to a portion of the attracting block, and a signal representing the detected temperature is outputted externally through a signal line 720. The Peltier device 704 has a structure wherein a semiconductive thermo-electric element is sandwiched between ceramic plates (alumina plates) 716. On the surface of the ceramic plate facing the semiconductive thermoelectric element 718, an electrode 717 is formed. In accordance with the quantity of electric current supplied through a current supply line 724, the temperature adjustment is carried out. Flow passageway 712 is formed in the cooling block 706, and it is communicated with a piping means 707.

The cooling block 706 is cooled by cooling water that flows through the piping means 707 and through flow passageway 712 in the cooling block 706. At this time, if the flow rate of the cooling water is too low, a large temperature difference is produced between the cooling water and the wall of the flow passageway 712 which may cause thermal deformation of the cooling block 706 and deformation of the wafer chuck as a whole.

FIG. 15 shows the results of measurement having been made by the inventors on the relationship between the flow rate of the cooling water and vibration, with the flow passageway 712 of a rectangular sectional shape. The flow rate was 0.15 m/sec at which in FIG. 15 the effect of the vibration can be neglected. The attracting block 701 was made of aluminum nitride (AlN) of a thickness 5 mm. The distance between the surface of the cooling block 706 and the flow passageway 712 was 5 mm. When the flow passageway had a rectangular sectional shape and the heat transfer coefficient was 300 $W/m^2 K$, for a heat flow density of 1000 $W/m^2$ a temperature difference of 3° C. was produced between the cooling water and the wall surface of the flow passageway 712. In an arrangement such as shown in FIG. 14 in which a Peltier device 704 is interposed between the cooling block 706 and the attracting block 701, even without consideration of the heat energy applied to the Peltier device 704, there occurs displacement at the back of the Peltier device 704.

Calculating the quantity of displacement of the Peltier device 704 according to simple one-dimensional approximation in the X and Y directions, it is "(linear thermal expansion coefficient $7 \times 10^{-6}$ of alumina which is the material of the ceramic plate 716)×(temperature rise 3° C.)×(length 30 mm of one side of the exposure field angle). That is, an expansion of 0.6 micron occurs. This causes more than a small displacement of the attracting block. As a result, a wafer attracted to the attracting block deforms and the printing precision degrades.

If the distance between the cooling surface and the attracting surface of the wafer chuck is small, the heat diffusion in the X-Y plane is small. In the step-and-repeat exposure process in which a plurality of fields are printed on one wafer, during the exposure the temperature of only such a filed to which X-rays are impinging rises, and there is substantially no temperature rise in the remaining fields. For this reason, in order to avoid thermal distortion of the wafer by means of constraint through the wafer chuck which is precisely temperature-regulated by a Peltier device, it is necessary to provide at least a pair of a temperature sensor and a Peltier device for each field angle and to control each Peltier device independently of the other Peltier devices, in response to a signal from an associated temperature sensor.

Referring to FIGS. 16A and 16B, inconveniences involved in an arrangement wherein plural Peltier devices are controlled in response to a detection signal from a single temperature sensor, will be explained.

Attracting block 701 for holding a wafer (not shown) to be exposed to a heat flow 901, is temperature controlled by means of three Peltier devices $704_1$–$704_3$. Temperature sensor 719 is mounted substantially at the center of the attracting block 701, and its output signal representing the detected temperature is applied through a converter 921 to a controller 922. In response to the detected temperature from the temperature sensor 719, the controller 922 controls a Peltier device control 923 to cause the same to supply electric currents to the Peltier devices $704_1$–$704_3$, to thereby control the temperatures of them.

As shown in FIG. 16A, if the temperature sensor 719 is not positioned within an exposure field angle which is being irradiated with the heat flow 901, there is a possibility that such a field angle whose temperature is just rising due to the exposure is not cooled. If this occurs, thermal expansion of a Peltier device ($704_1$) provided in relation to such a field angle and to its region, is produced, and this results in broadening of the printed linewidth (as compared with a mask pattern) or widening of a space between adjacent patterns.

If, as shown in FIG. 16B, the temperature sensor 719 is located in an exposure field angle which is being irradiated with the heat flow 901, on the other hand, there is a possibility that the remaining field angles are overcooled. If this occurs, thermal contraction of the Peltier devices ($704_1$ and $704_3$) positioned in the non-exposure field angles and their regions is produced, and this results in a positional deviation between the mask and the exposure field angle.

In the wafer supporting device of the type as described, there is a problem that, if the cooling water flows at a rate with which the effect of vibration can be neglected, displacement of the attracting block occurs, causing degradation of the wafer printing precision.

SUMMARY OF THE INVENTION

It is accordingly an object of the present invention to provide an exposure wafer holding device, by which the wafer can be cooled without degradation of the pattern transfer precision.

In an exposure wafer holding device according to one aspect of the present invention, which is for use in an exposure apparatus having a wafer chuck mounted to a stage of low rigidity, the wafer chuck is provided with a hollow member having a heat pipe structure and, between the wafer chuck and the stage, a cooling plate having an internal structure allowing circulation of a cooling medium is interposed.

The hollow member may be divided along a longitudinal direction.

With the provision of a wafer chuck by using a hollow member having a heat pipe structure, the heat flow impinging on the heat receiving surface of the wafer during the exposure can be diffused within the hollow member of the wafer chuck. Therefore, the heat flow density at the cooling surface of the wafer chuck (the surface contacting the cooling plate having an internal structure for allowing circulation of the cooling medium), can be decreased in accordance with the ratio in area between the heat receiving surface and the cooling surface. This enables considerable reduction in the flow rate of the cooling medium, flowing through the cooling plate.

As a result, even if the wafer chuck to which a wafer is to be attracted is mounted to a stage having low rigidity, it is possible to maintain displacement of the wafer sufficiently small during the exposure process and, advantageously, it is possible to cool the wafer without degradation of the pattern transfer precision.

Since, in an X-ray exposure apparatus using synchrotron radiation light as a light source, a wafer chuck is placed upstanding, the dividing of the hollow member longitudinally allows efficient circulation of the operative fluid. It is therefore possible to efficiently prevent a dry-out phenomenon.

It is another object of the present invention to provide a wafer holding device with simplified control and structure, by which displacement of an attracting block is prevented even with a small flow rate of a level not causing a non-negligible effect of vibration.

A wafer holding device according to another aspect of the present invention comprises attracting means for holding a wafer, and a Peltier device for adjusting temperature of the attracting device, wherein a heat pipe is provided at one surface of the Peltier device on the opposite side of the Peltier device surface contacting the attracting means.

A wafer holding device may be equipped with attracting means for holding a wafer, a temperature sensor for detecting temperature of the attracting means, and a Peltier device for adjusting the temperature of the attracting means, wherein the control of the temperature of the attracting means may be effected on the basis of the temperature detected by the temperature sensor.

In either case, a heat pipe may be provided between the Peltier device and the attracting means.

In a heat pipe having a high heat transfer coefficient and a low thermal resistance, heat can be diffused quickly. For this reason, the heat flow inputted to one surface (heat receiving surface) of the heat pipe through the attracting means and the Peltier device during exposure, can be diffused toward the whole surface to the other surface (cooling surface). On the other hand, the heat flow inputted to the one surface (heat receiving surface) of the heat pipe through the attracting means during the exposure, can be diffused toward the other surface (cooling surface) and thereafter the cooling can be effected by means of the Peltier device. Thus, efficient cooling is attainable.

If a temperature sensor and a Peltier device are disposed at a position where the temperature is averaged by a heat pipe, then only one pair of them are necessary for each heat pipe. Thus, this is effective for simplification of the structure.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
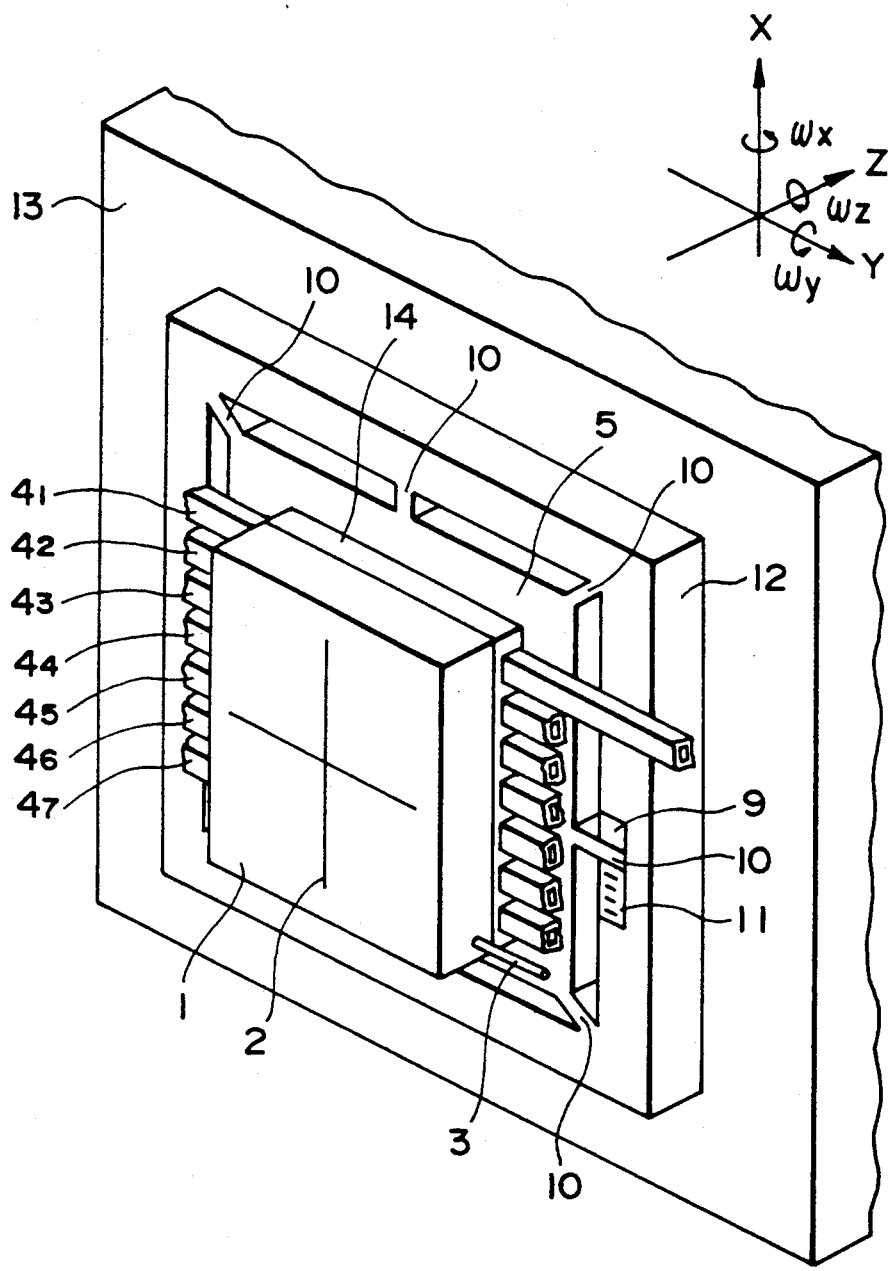
FIG. 1 is a schematic view of a wafer holding apparatus for use in an exposure apparatus, according to a first embodiment of the present invention.

FIG. 1 is a schematic view of a wafer holding block of a wafer holding device, for use in an exposure apparatus, according to a first embodiment of the present invention.

The wafer holding block comprises a rough-motion stage 13 for effecting relatively rough alignment of a wafer to a reticle in the X-axis, Y-axis and Z-axis directions illustrated; a support table 12 mounted to the rough-motion stage 13; a fine-motion stage 5 provided at the middle of the support table 12, for effecting fine alignment of the wafer to the reticle; and a wafer chuck 1 mounted to the fine-motion stage 5. The wafer chuck 1 can be moved in the X-axis, Y-axis and Z-axis directions by the rough-motion stage 13 which is driven by means of actuators (not shown). Also, it can be moved by the fine-motion stage 5 in the X-axis, Y-axis and Z-axis directions as well as in the ws, wy and wz directions (rotational directions about the X, Y and Z axes, respectively). However, for simplicity, it is illustrated as being movable minutely in the wz direction by means of the fine-motion stage 5. More specifically, the fine-motion stage 5 is a low rigidity stage, and it is supported at its four corners and at the centers of the four sides by means of leaf springs 10, on the support table 12. It can be displaced in the wz direction minutely through a drive from a combination of a rubber 9 and a piezoelectric device. Further, the wafer chuck 1 is formed with a vacuum attraction groove 2 of cross shape which communicates with a vacuum pump (not shown) via a vacuum piping means 3. The described structure is essentially the same as that having been described with reference to FIG. 11.

Figure 2:
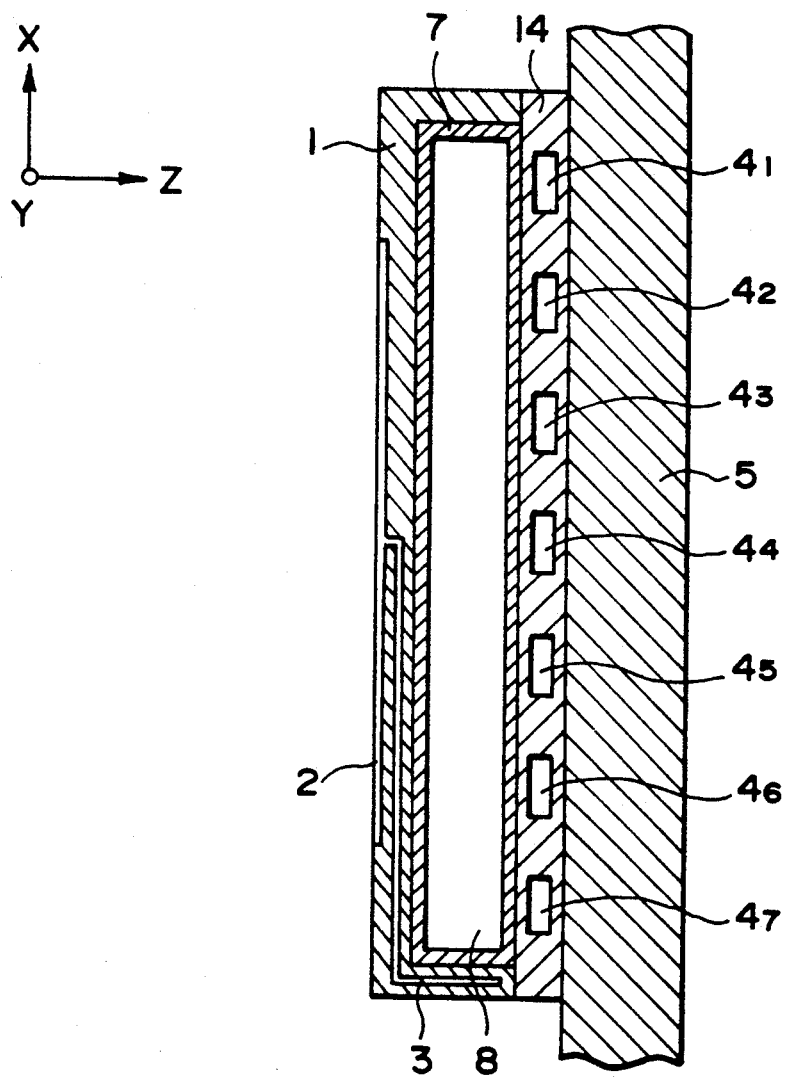
FIG. 2 is a sectional view showing an internal structure of a wafer chuck in the FIG. 1 embodiment.
Figure 11:
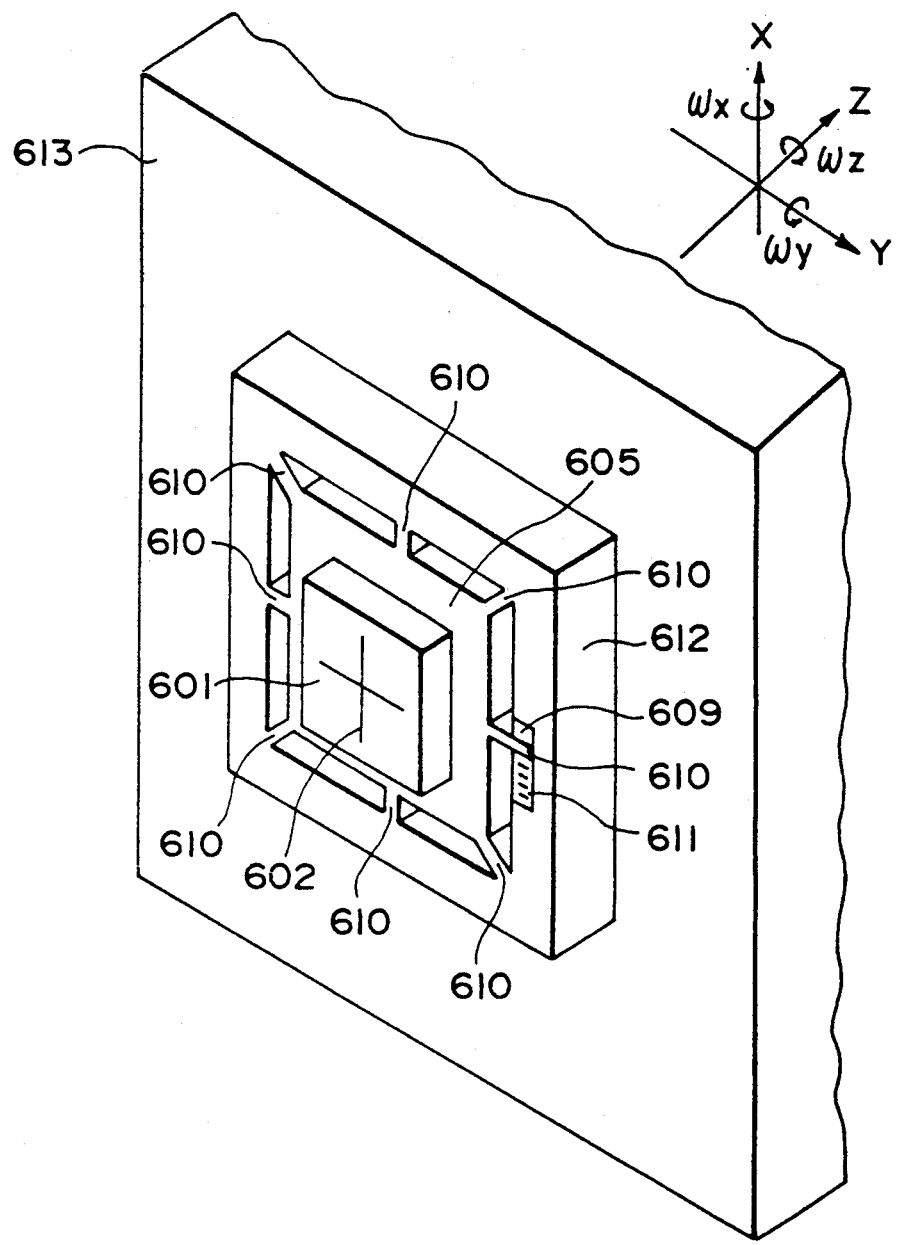
FIG. 11 is a schematic view of a known type wafer holding device in an X-ray exposure apparatus which uses synchrotron radiation light as a light source.
Figure 12:
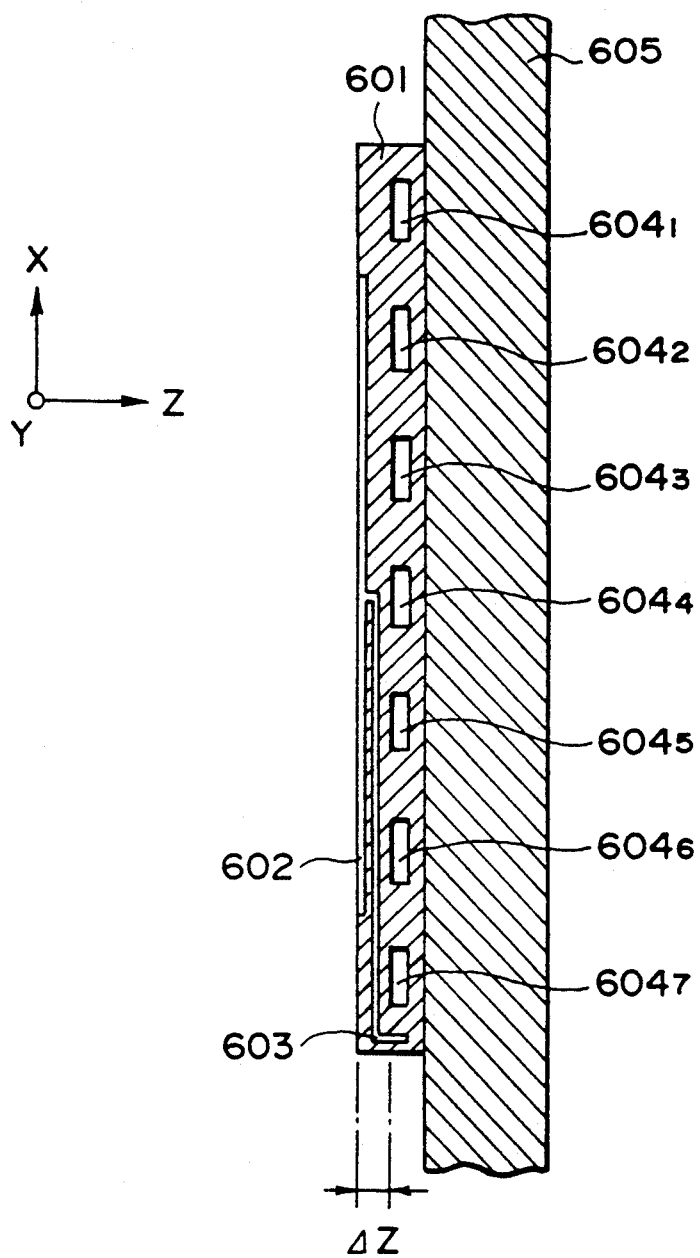
FIG. 12 is a sectional view of a known type a wafer chuck.
Figure 13:
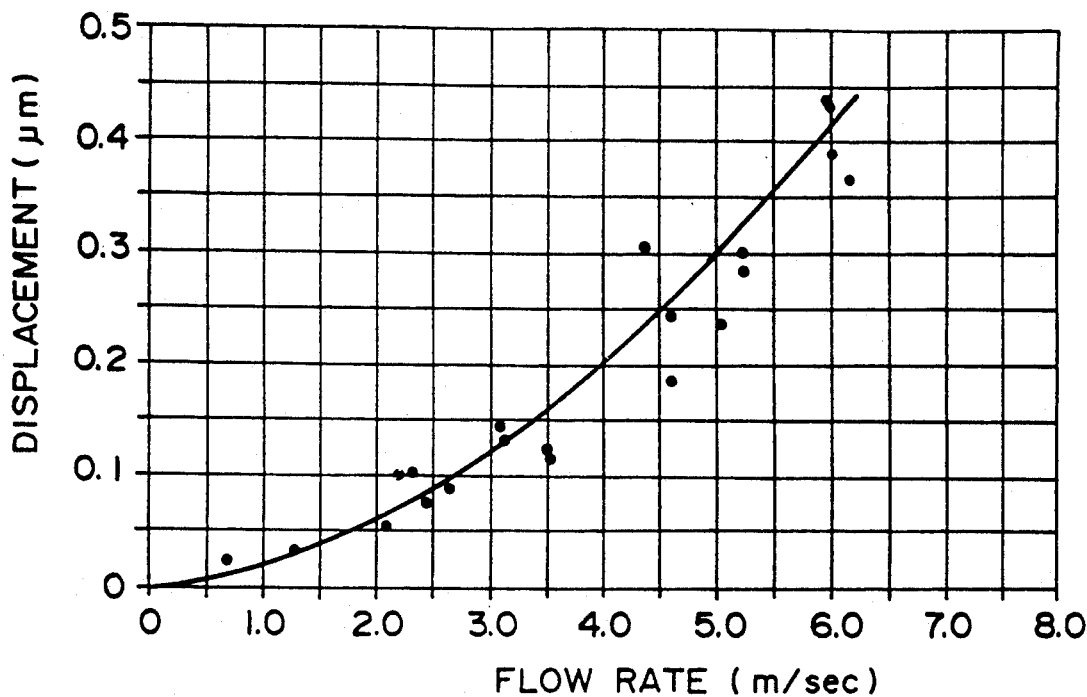
FIG. 13 is a graph showing results of measurement having been made by the inventors on the relationship between the flow rate of cooling water and the displacement of a wafer chuck of known type.
Figure 14:
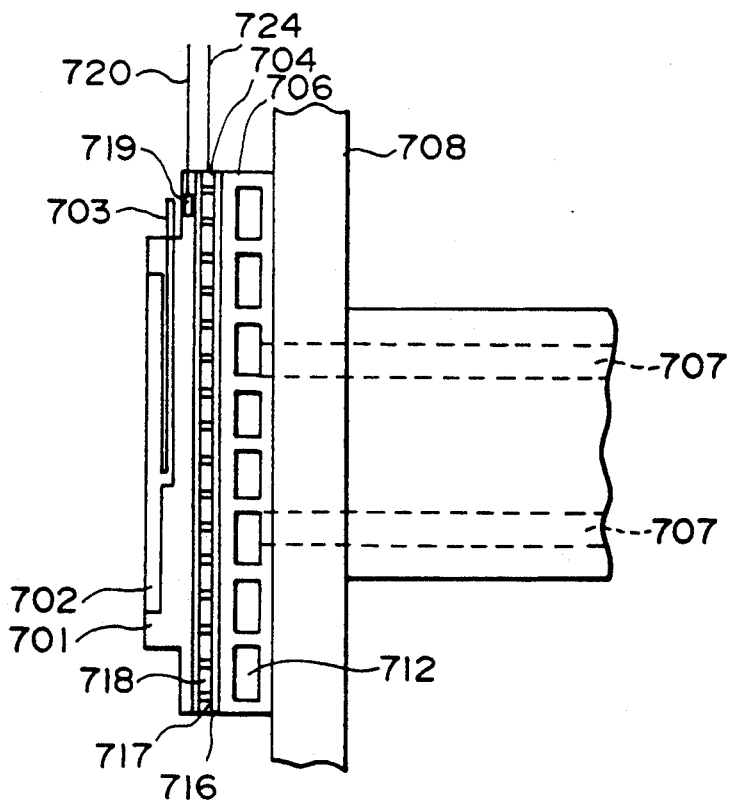
FIG. 14 is a sectional view of another example of a wafer chuck of known type.
Figure 15:
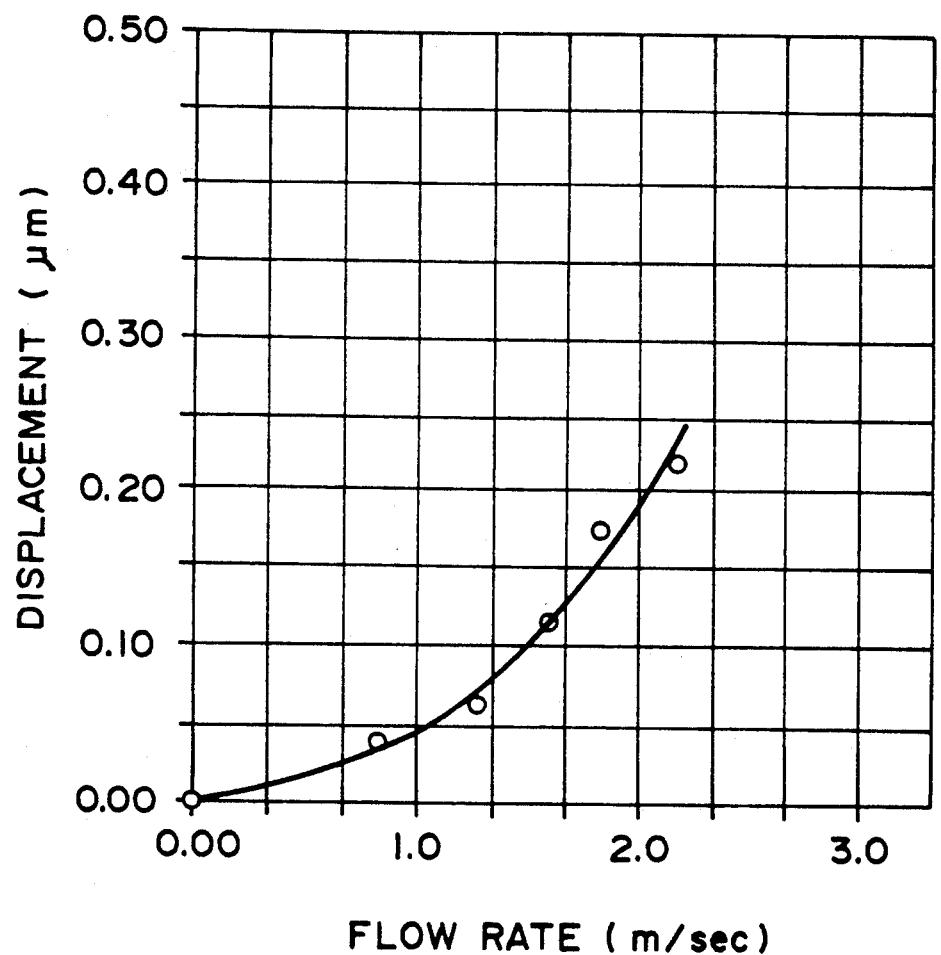
FIG. 15 is a graph showing results of measurement having been made by the inventors on the relationship between the flow rate of cooling water and the displacement of a wafer chuck of known type.
Figure 16A:
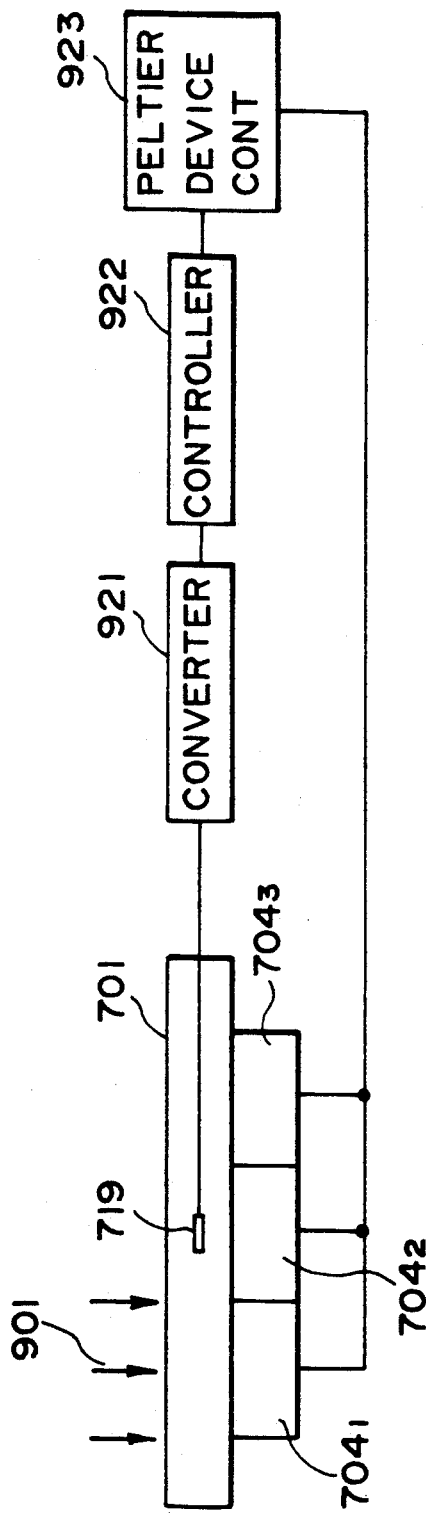
FIGS. 16A and 16B are sectional views, respectively, for explaining different states of a substrate on the wafer chuck of the FIG. 14 example, during exposure thereof.
Figure 16B:
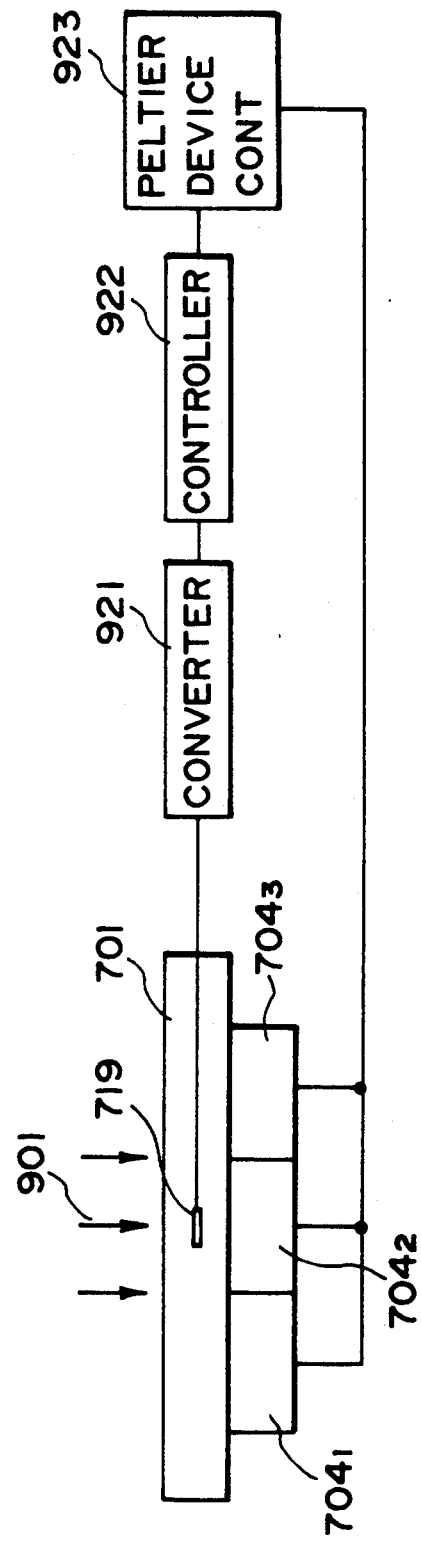

However, as best seen in FIG. 2, it differs from the FIG. 11 arrangement in that: the wafer chuck 2 comprises a hollow member having a heat pipe structure (i.e. the wafer chuck is made of an Al material having good heat conductivity and has a reduced-pressure inside space 8, and a wick 7 wetted with an operative liquid is adhered to the inside wall of the space 8), and a cooling plate 14 having seven cooling water flow passageways $4_1$–$4_7$ formed therein equidistantly in the X-axis direction is interposed between the fine-motion stage 5 and the wafer chuck 1.

The pressure in the inside space 8 is maintained reduced to keep the boiling point of the operative liquid at about 20.0° C. Also, to the cooling water flow passageways $4_1$–$4_7$. cooling water whose temperature is adjusted at about 20.0° C. by means of a constant-temperature vessel is circulated as a cooling medium.

Next, the operation of this wafer holding block will be explained.

By the circulation of the cooling water through the flow passageways $4_1$–$4_7$ by means of the constant temperature vessel, the cooling surface of the wafer chuck 1 (the surface contacting to the cooling plate 14) is maintained at a temperature of about 20.0° C.

A wafer to which a mask pattern is to be transferred is conveyed to a position to be opposed to the attracting surface of the wafer chuck, by means of a conveying hand (not shown) of known type. After this, as a result of communication of the cross-shaped vacuum attraction groove 2 with the vacuum pump through the vacuum attraction piping 3, the wafer is vacuum-attracted to the wafer chuck 1. Thereafter, the rough-motion stage 13 is driven by actuators (not shown) while the fine-motion stage 5 is driven by the piezoelectric device 11, whereby alignment of the wafer with respect to the reticle is effected.

After completion of the alignment operation, X-rays (synchrotron radiation light) are projected along the Z-axis direction in FIG. 2, thus the exposure operation starts. Since the exposure operation is effected in the step-and-repeat manner, the range of irradiation of X-rays per each exposure is about 3 cm square (9 cm$^2$).

Here, since the spacing between the attracting surface of the wafer chuck 1 and the wick 7 at the attracting surface side is small and also the thickness of the wafer is small, any heat produced during the exposure is transferred to the wick 7 at the attracting surface side without being diffused to the X-Y plane illustrated in FIG. 2. If, therefore, the incident heat flow density of the X-rays is 100 mW/cm$^2$, then on the wick 7 at the attracting surface side, about 100 mW/cm$^2$ of heat flow density impinges against an area of about 3 cm square corresponding to the range of X-ray irradiation.

Since the temperature of the portion of the wick irradiated with the heat flow density rises due to the impingement of the same, the saturated vapor pressure rises and, as a result, the operative liquid in the wick 7 is evaporated with deprivation of heat of vaporization. Due to the pressure distribution produced at this time in the inside space 8, the evaporated operative liquid is instantaneously diffused and reaches the wick at the cooling surface side. Since the temperature of the cooling surface is maintained at about 20.0° C. by means of the cooling water, the operative liquid vapors contacting the wick at the cooling surface side are condensed into liquid and absorbed by the wick 7 at the cooling surface side. This ensures that, if the temperature of the wafer rises during the exposure operation, almost all the heat resulting therefrom is consumed by the evaporation of the operative liquid. Thus, the temperature of the wafer can be maintained constant. The operative liquid as absorbed is diffused by the capillary phenomenon in the wick 7, and it is circulated back to the wick 7 at the attracting surface side.

Also, since the operative liquid vapors contacting to the wick at the cooling surface have been diffused, the heat flow density at the cooling surface is reduced. For example, if the area of the cooling surface is 15 cm square (225 cm$^2$), then it is reduced to about 4 mW/cm$^2$ ($=100$ mW/cm$^2\times9$ cm /225 cm). It is therefore possible to reduce the flow rate of the cooling water through the flow passageways $4_1$–$4_7$, as compared with the known example. More specifically, if in the known example shown in FIG. 5 it is necessary to flow the cooling water through the flow passageways $104_1$–$104_7$ at a rate of about 5 m/sec in order to avoid a temperature rise of the wafer over 0.05° C. to the heat flow density of 100 mW/cm$^2$, in the present embodiment since the heat flow density at the cooling surface is reduced to about 4 mW/cm$^2$ only the flow of the cooling water through the flow passageways $4_1$–$4_7$ at a rate not higher than about 0.5 m/sec is sufficient to avoid a temperature rise of the wafer over 0.05° C. Thus, in the present embodiment, it is possible to reduce the wafer displacement to about 1/100 as compared with the known example.

If water is used as the operative liquid, the pressure in the inside space 8 of the wafer chuck 1 may be reduced to about 20 Torr so as to provide a boiling temperature of the water of about 20.0° C.

Figure 3:
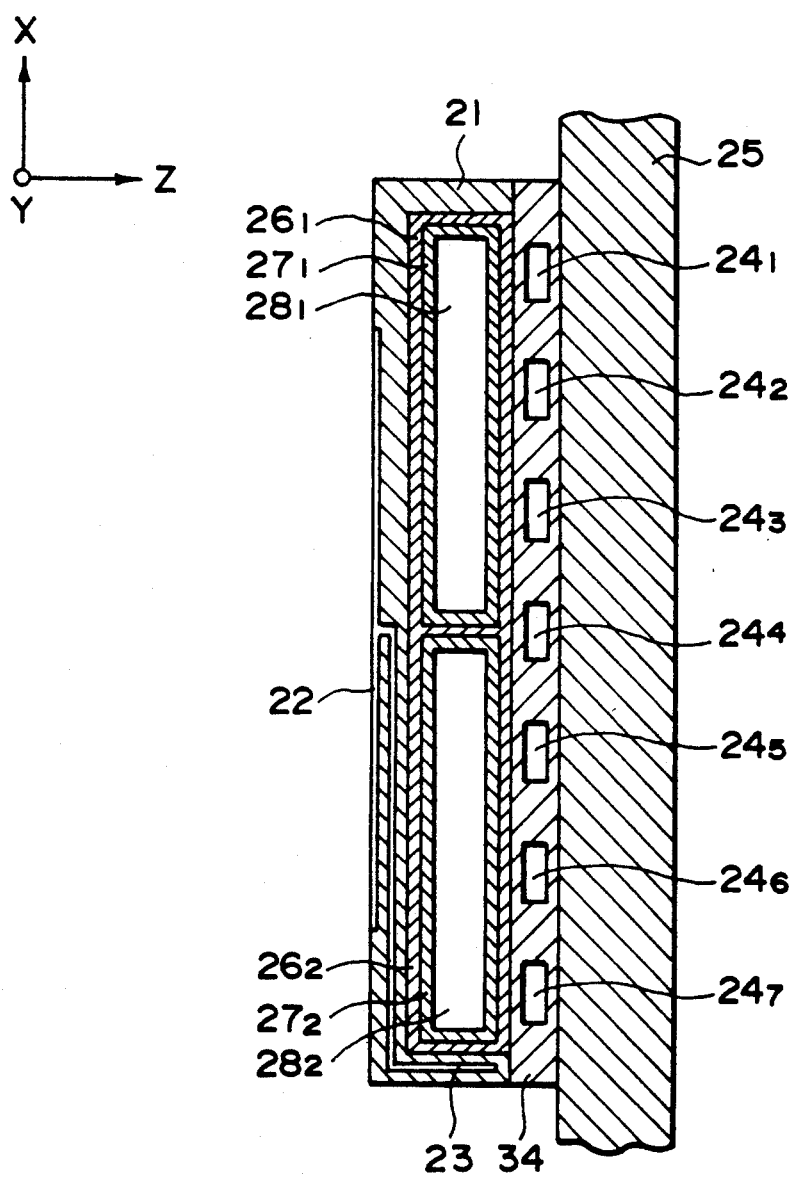
FIG. 3 is a sectional view showing an internal structure of a wafer chuck according to a second embodiment of the present invention.

FIG. 3 is a sectional view showing the internal structure of a wafer chuck in a second embodiment of the wafer holding device of the present invention, for use in an exposure apparatus.

The wafer holding device for use in an exposure apparatus, according to the present embodiment, differs from the FIG. 2 embodiment in that: a wafer chuck 21 is equipped with a container which is disposed in its inside space and which is divided into two containers $26_1$ and $26_2$ with respect to the longitudinal (vertical) direction, each comprising a hollow member having a heat pipe structure.

The containers $26_1$ and $26_2$ are made of a material of Al having a good heat conductivity, and their inside spaces $28_1$ and $28_2$ are completely isolated from each other and are maintained at a reduced pressure. They have wicks $27_1$ and $27_2$ adhered to their inside walls, respectively.

Also, in the wafer holding device of the present embodiment, when the step-and-repeat exposure is effected from above in FIG. 3, since the spacing between the attracting surface of the wafer chuck 21 and the heat receiving surface of each container $26_1$ or $26_2$ (the surface opposed to the attracting surface) is small and the thickness of the wafer is small, any heat produced during the initial period of the exposure operation is transferred to the heat receiving surface of the container $26_1$ without being diffused. At this time, since the temperature of the wick $27_1$ adhered to the inside of the heat receiving surface of the container $26_1$ rises, the saturated vapor pressure increases with a result of evaporation of the operative liquid within the wick $27_1$ with deprivation of the heat of vaporization. By the pressure distribution produced in the inside space $28_1$ at this time, the evaporated operative liquid is instantaneously diffused and reaches the wick at the cooling surface side of the container $26_1$ (the surface contacting the cooling plate 34). Since the temperature of this cooling surface is maintained at about 20.0° by means of temperature-controlled cooling water, circulating through cooling water flow passageways $24_1$-$24_7$. the operative liquid vapors contacting the wick at the cooling surface side are condensed into liquid and absorbed by the wick $27_1$ at the cooling surface side. This ensures that, if the temperature of the wafer rises during the exposure operation, almost all the heat resulting therefrom is consumed by the evaporation of the operative liquid. Thus, the temperature of the wafer can be maintained constant. The operative liquid as absorbed is diffused by the capillary phenomenon in the wick $27_1$, and it is circulated back to the portion of the wick $27_1$ from which the operative liquid has been evaporated.

As described, in the wafer holding device of the present embodiment, since the operative liquid vapors contacting the wick at the cooling surface side of the container $26_1$ have been diffused, like the wafer chuck of FIG. 2, it is possible to reduce the flow rate of the cooling water through the flow passageways $24_1$-$24_7$, as compared with the known example.

Also, bisecting the container inside the wafer chuck 21 with respect to the longitudinal direction ensures efficient circulation of the operative liquid and, therefore, it is possible to prevent the dry-out phenomenon. More particularly, if for the exposure the wafer chuck is disposed upstanding (with its wafer holding surface extending substantially vertically) as used in an X-ray exposure apparatus which uses synchrotron radiation light as a light source, the operative liquid as cooled by the cooling surface and then condensed is circulated back to the portion of the wick $27_1$ from which it has been evaporated, under the influence of the capillary action against gravity. Thus, for a shorter length of the wick $27_1$ in the longitudinal direction, more efficiently the operative liquid can be circulated.

While in the present embodiment the container inside the wafer chuck is bisected with respect to the longitudinal direction, for exposure of a long time period, it is effective to increase the number of the divisions of the container in the point of prevention of the dry-out phenomenon at the heat receiving surface. Thus, within the limit of assurance of the wafer vibration prevention, the number may be increased.

Also, while in the present embodiment the wafer chuck 21 comprising a hollow member with a heat pipe structure is provided by the containers $26_1$ and $26_2$ and the wicks $27_1$ and $27_2$ as well as the inside spaces $28_1$ and $28_2$, in place thereof, the inside space 8 of the wafer chuck 1 of the FIG. 1 embodiment may be bisected with respect to the longitudinal direction.

Figure 4:
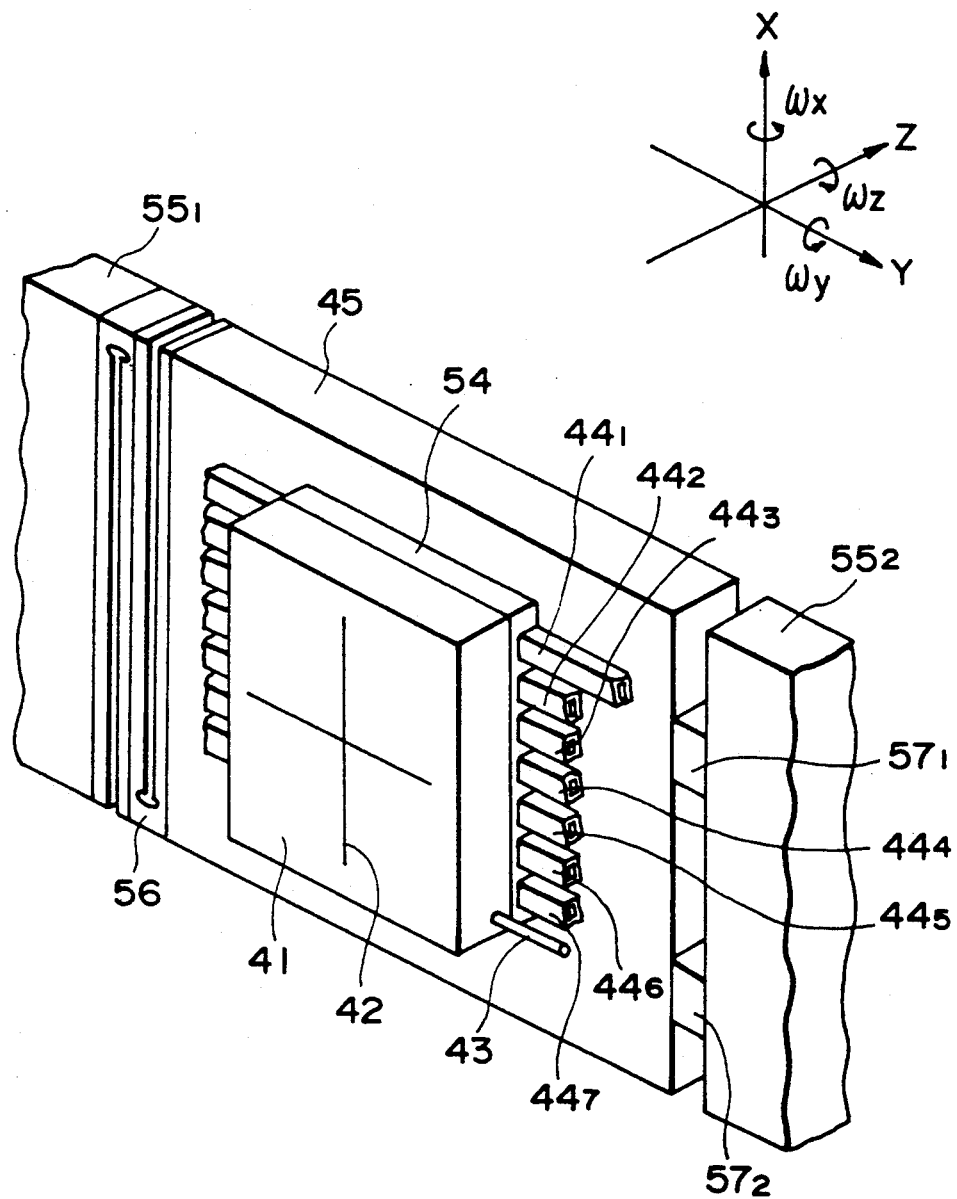
FIG. 4 is a schematic view of a fine-motion stage according to the present invention.

In the foregoing embodiments, the wafer chuck 1 or 21 is mounted to the fine-motion stage 5 or 25 having the structure as shown in FIG. 1. However, the structure of the fine-motion stage is not limited to this, but it may be that shown in FIG. 4.

This fine-motion stage 45 is mounted onto a rough-motion stage (not shown) which is at a side opposite to a wafer chuck 41 of the fine-motion stage, by means of two fixing means $55_1$ and $55_2$. Here, between the fine-motion stage 45 and the lower right one ($55_1$ in the drawing) of the fixing means, two actuators $57_1$ and $57_2$ are interposed. Also, between the fine-motion stage 45 and the upper left one ($55_2$ in the drawing) of the fixing means, a hinge spring 56 is interposed to normally urge the fine-motion stage 45 toward the two actuators $57_1$ and $57_2$.

With the drive of both of the two actuators $57_1$ and $57_2$, the fine-motion stage 45 is moved minutely along the Y-axis direction in the drawing. Also, with the drive of one of these actuators, it is moved minutely in the wz direction in the drawing.

On such a fine-motion stage 45, the wafer chuck 41 of the same structure as that of the wafer chuck 1 (FIG. 2) or 21 (FIG. 3) is mounted with the intervention of a cooling plate 54 having seven cooling water flow passageways $44_1$-$44_7$ formed equidistantly therein (in the X-axis direction in the drawing) for circulation of temperature-controlled cooling water. This ensures a wafer holding device for an exposure apparatus, having substantially the same advantageous effects.

While, in the embodiments described hereinbefore, the vacuum attraction groove 2, 22 or 44 formed in the wafer chuck 1, 21 or 41 has a cross shape, it may have a different configuration such as a radial shape, for example. Also, the number "seven" of the cooling water flow passageways $4_1$-$4_7$, $24_1$-$24_7$ or $44_1$-$44_7$ may be changed.

Further, while the wafer chuck 1, 21 or 41 is arranged to provide vacuum attraction through a combination of the vacuum evacuation piping means 3, 23 or 43 with a vacuum pump (not shown), it may be modified to provide magnetic attraction or electrostatic attraction of known type.

While the foregoing description has been made of a wafer holding device for an exposure apparatus, usable in an X-ray exposure apparatus in which synchrotron radiation light is used as a light source, the wafer holding device of the present invention may be used in an exposure apparatus which uses light other than the synchrotron radiation light (for example, g-line or i-line light, or an excimer laser), with substantially the same advantageous effects.

Figure 5:
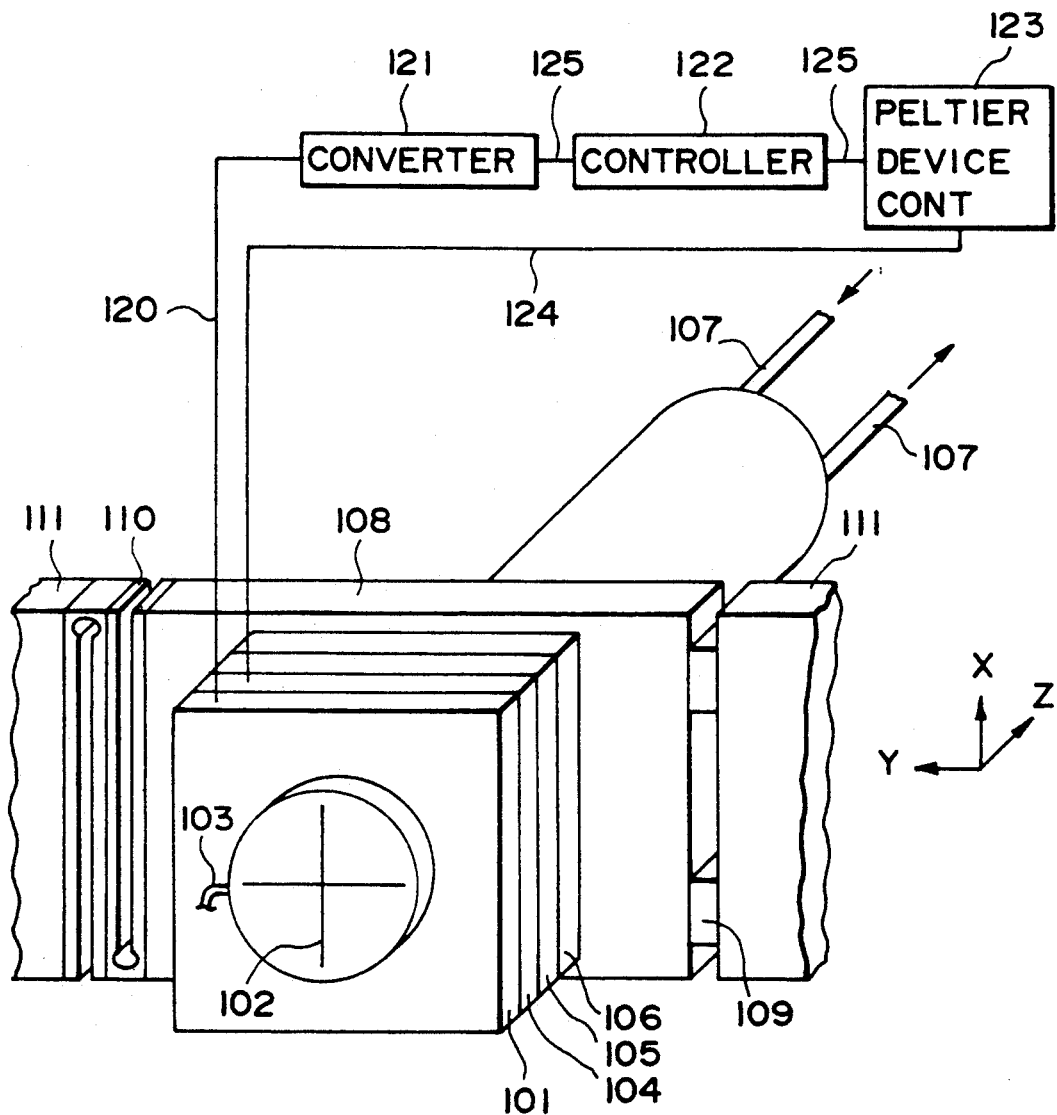
FIG. 5 is a schematic view of a wafer holding device for use in an exposure apparatus, according to a third embodiment of the present invention.
Figure 6:
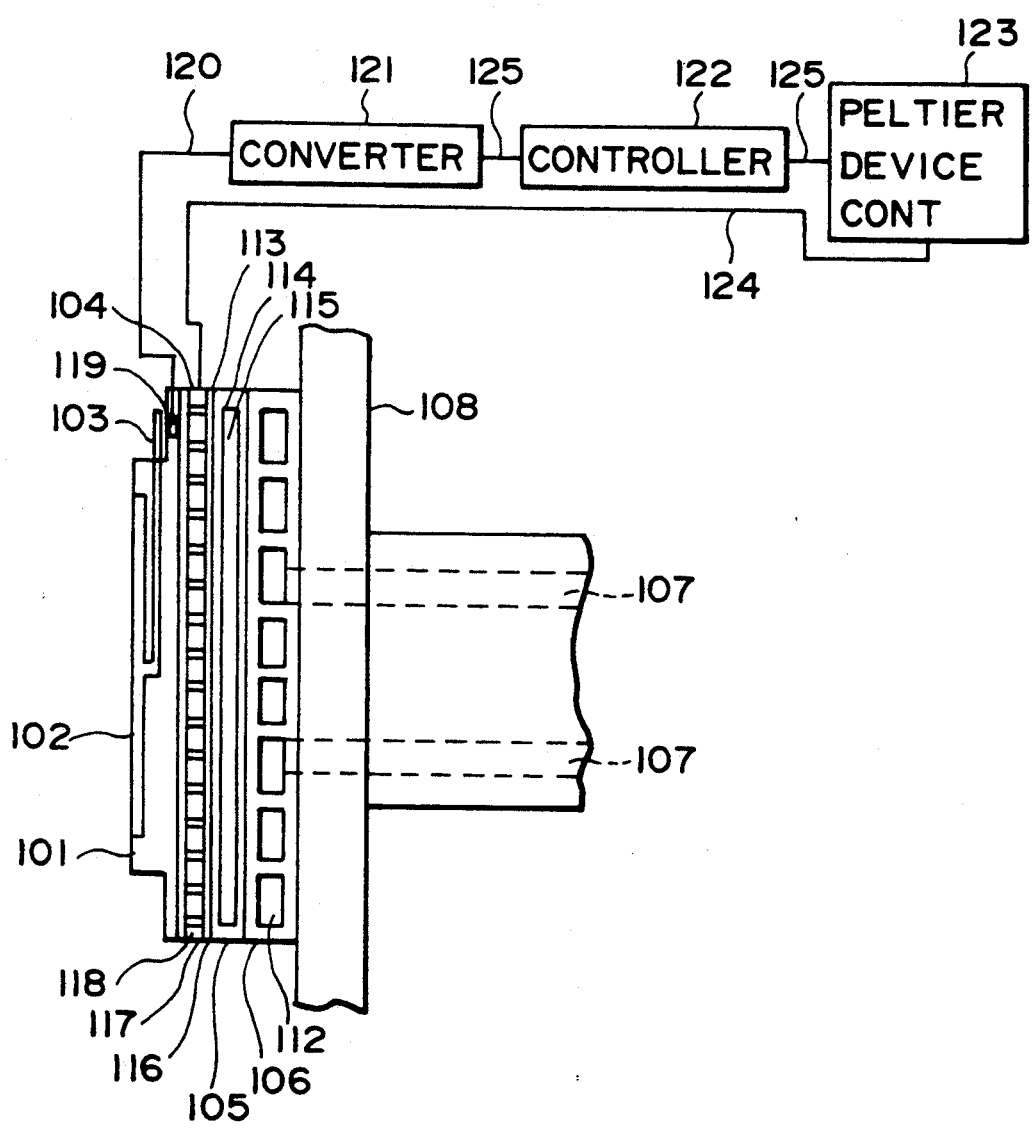
FIG. 6 is a sectional view showing an internal structure of a wafer chuck in the FIG. 5 embodiment.

FIG. 5 is a perspective view showing the structure of a third embodiment of the present invention, and FIG. 6 is a sectional view thereof.

Attracting block 101 which is an attracting means for holding a wafer, is made of such a material which has good heat conductivity and a low thermal expansion coefficient and which can be easily machined. It is mounted to a stage 108 with the intervention of a Peltier device 104, a heat pipe 105 and a cooling block 106, in this order. The stage 108 is mounted to fixing means 111 through actuators 109 and a hinge spring 110, and it can be moved in the X-axis direction minutely. Basically, a high-precision positioning stage is made movable in six directions (X, Y and Z directions as well as in rotational directions about theses axes), but here, for simplicity, the stage 108 is illustrated only with the structure as allowing fine motion in the X direction.

The attracting block 101 is equipped with a temperature sensor 119 (lf 6) for detecting the temperature of the attracting block 101. The temperature sensor 119 comprises a platinum temperature detecting resistor, for example, and it is mounted to such an end portion of the attracting block 101 which is less effected by the exposure and the temperature averaging by the heat pipe 105 is accomplished. The signal from the temperature sensor 119 representing the detected temperature is applied to a converter 121 through a signal line 120. The input signal is converted by the converter 121 into a digital signal which in turn is applied to a controller 122 through a signal line 125. The controller 122 determines a set temperature for the Peltier device 104 on the basis of the detected temperature of the temperature sensor 119, and applies a corresponding signal to a Peltier device controller 123. In response thereto, the Peltier device controller 123 supplies an electric current to the Peltier device 104 so as to adjust the temperature of the same to the set temperature.

The attracting block 101 has a groove 102 formed in its attracting surface, and a vacuum attraction piping means 103 formed within the block. Also, as described, the temperature sensor 119 is mounted to a portion of the attracting block, and a signal corresponding to the detected temperature is outputted through the signal line 120.

The Peltier device 104 has a structure in which semi-conductive thermo-electric elements 118 are sandwiched between ceramic (alumina) plates 116. Electrode 117 is formed on the surface of the ceramic plate 116, and, in accordance with the electric current supplied thereto through a current supply line 124, the temperature adjustment is effected.

The heat pipe 1-5 comprises a container 113 having therein a combination of a wick 114 and saturated vapors (operative liquid) 115, for keeping the inside surface of the container 113 wetted with the operative liquid under the influence of the capillary action. Since a method of manufacturing such a heat pipe structure is described, e.g., in Japanese Laid-Open Patent Application, Laid-Open No. 58-096992 and many modifications thereof have been proposed, further details will not be explained here.

The cooling block 106 has formed therein cooling water flow passageways 112 each having a rectangular sectional shape and being communicated with a piping means 107. Thus, the cooling block 106 can be cooled by the cooling water flowing through the piping means 107 and the flow passageways 112.

The transmission of heat in this embodiment will now be explained.

If exposure light is projected to a wafer held by the attracting block 101 of the present embodiment, the heat produced thereby is transmitted to the heat pipe 105, provided along the Z direction, substantially without being diffused over the X-Y plane. Since the heat pipe 105 has a very high heat conductivity and a low thermal resistance, the heat transmitted thereto is diffused quickly over the X-Y plane, whereby efficient cooling based on the whole cooling surface of the heat pipe 105 is assured.

Practical numerical quantities will be discussed.

X-rays are projected along the Z direction onto a wafer, being attracted to the vacuum attraction groove 102 of the attracting block 101. One field angle of area of exposure, to be printed on the wafer, is 3 cm square (9 cm$^2$), the incident heat flow density of the X-rays is 1000 W/m$^2$, and the area of the heat pipe 105 at the cooling side (the cooling block 106 side) is 15 cm square (225 cm$^2$). Since the thickness of each of the wafer, the attracting block 101 and the Peltier device 104 is small, substantially no portion of the heat produced as a result of the X-ray irradiation is diffused over the X-Y plane. Consequently, a heat flow of a heat flow density of about 1000 W/m$^2$ impinges on the heat receiving side (Peltier device 104 side) of the heat pipe 105.

Since the heat transmitted to the heat pipe is quickly diffused to the X-Y plane (substantially parallel to the vertical plane), upon the cooling side of the heat pipe 105, a heat flow density of about 40 W/m$^2$ is produced.

As regards the amplitude of vibration caused by the flow of cooling water, it may be not higher than 0.01 micron if the flow rate of the cooling water is not higher than 0.15 m/sec.

If the flow rate of the cooling water is 0.15 m/sec and the heat transfer coefficient of the flow passageway 112 of rectangular sectional shape is 300 W/m$^2$K, then, for a heat flow density of 40 W/m$^2$, it is possible to suppress a temperature rise in the cooling water and at the wall of the flow passageway 112 to about 0.1° C. Here, if the quantity of displacement of the Peltier device 104 at the heat pipe 105 side in the X and Y directions is calculated according to a simple linear approximation with respect to the X and Y directions, then "linear expansion coefficient $7 \times 10^{-6}$ of alumina which is the material of the ceramic plate 116) $\times$ (temperature rise 0.1° C.) $\times$ (length 30 mm of each side of one exposure field angle)" results. Namely, a small expansion of 0.02 micron occurs. This causes only a very small displacement of the attracting block 101.

Also, in the present embodiment, as illustrated the area of the heat receiving portion of the heat pipe 105 is made larger than that of the wafer attracting portion of the attracting block 101, and the bottom face of the wafer attracting portion is assuredly cooled by the wick of the heat pipe 105. Therefore, insufficient cooling does not occur.

In the present embodiment, there is no necessity of providing a pair of a temperature sensor and a Peltier device for each field angle as in the conventional arrangement. Only the provision of them to one heat pipe is necessary. Therefore, the structure is simple and compact, and the control thereof is easy.

Figure 7:
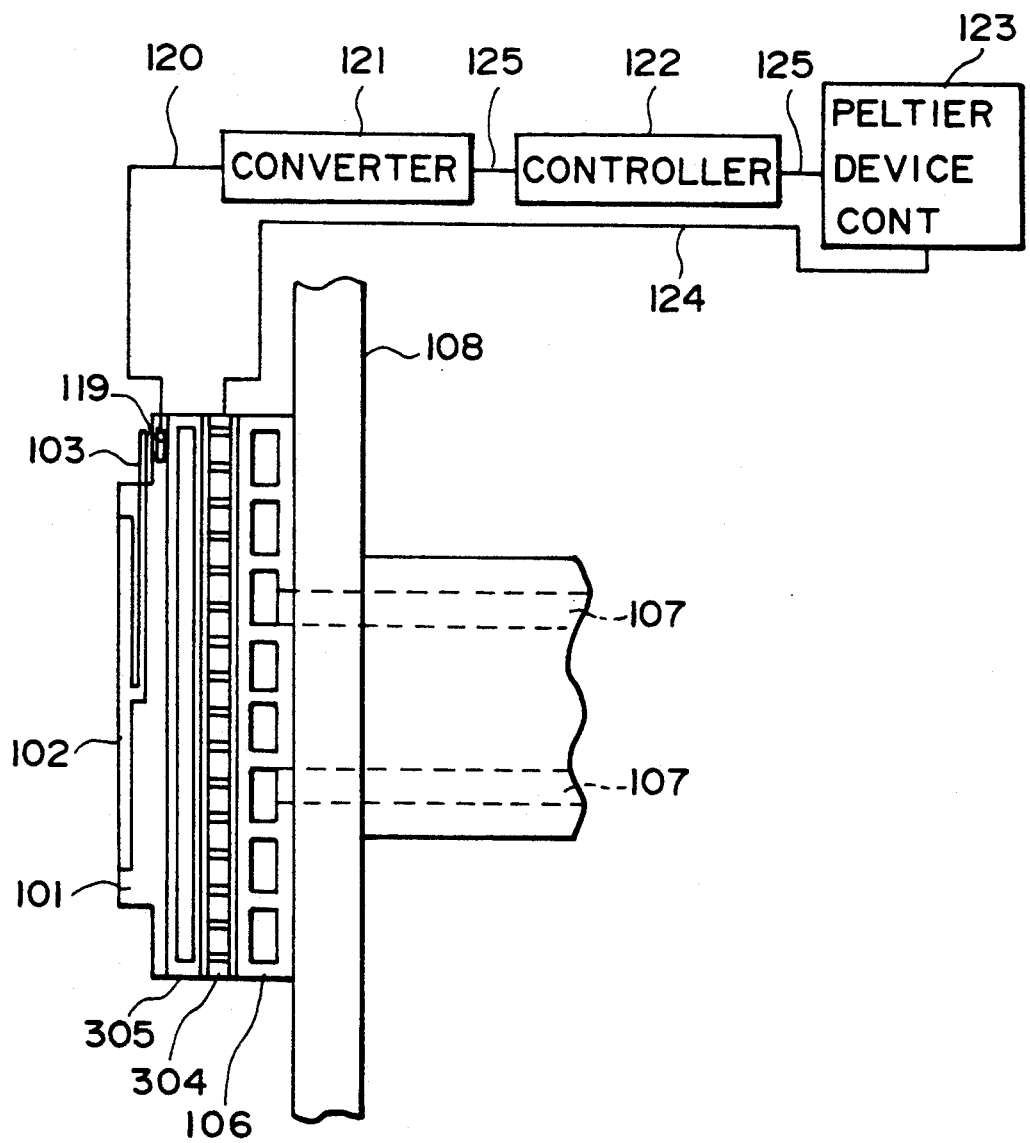
FIG. 7 is a sectional view showing an internal structure of a wafer chuck according to a fourth embodiment of the present invention.

FIG. 7 shows the structure of a fourth embodiment of the present invention.

In this embodiment, the disposition of the Peltier device 104 and the heat pipe 105 in the third embodiment is inverted (as a Peltier device 304 and a heat pipe 305). The remaining portion of the structure is essentially the same as the third embodiment, and description of them will be omitted here by assigning like numerals of FIG. 5 to corresponding elements.

Like the third embodiment, also with the structure of the present embodiment it is possible to reduce the displacement of the attracting block 101 to be caused as a result of the exposure operation. Further, since it is sufficient that the temperature sensor 119 is provided between the wafer and the Peltier device 304, in the present embodiment it may be provided on the heat pipe 305.

Figure 8:
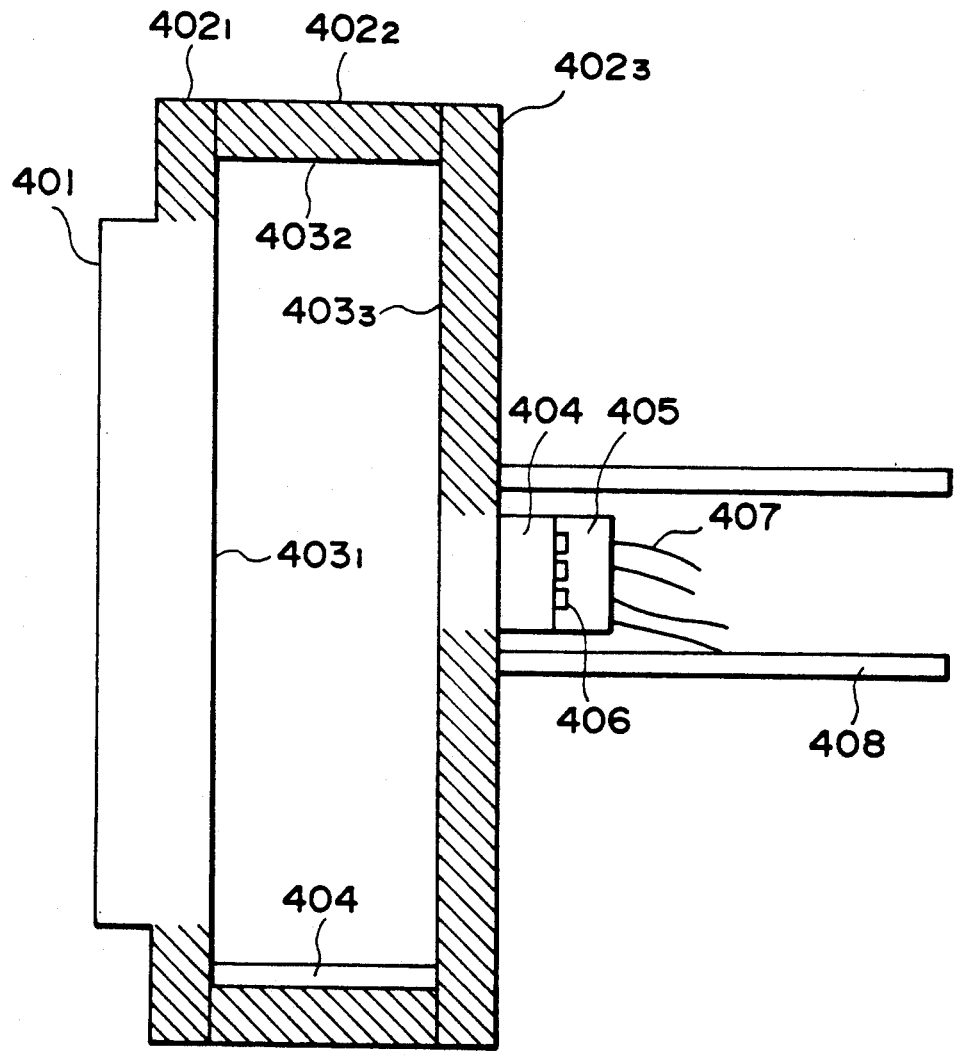
FIG. 8 is a sectional view showing an internal structure of a wafer chuck according to a fifth embodiment of the present invention.

FIG. 8 shows the structure of a fifth embodiment of the present invention.

In this embodiment, the wafer attracting block of the third or fourth embodiment is modified so that it is a constitutional element of the heat pipe.

More specifically, in this embodiment, the container of the heat pipe structure is provided by plural constitutional elements $402_1$–$402_3$. On the inside surfaces of these elements, facing the inside space of the container, wicks $403_1$–$403_3$ are formed. For the formation of a wick, as an example, machining (by a dicing saw or the like), etching or dry etching may be used to form grating-like grooves or the like with a depth in units smaller than millimeters. In this embodiment, machining is used.

In a portion of the outside surface of a first constituent element $402_1$, a wafer attracting surface 401 is formed. In a portion of the outside surface of a third constituent element $402_3$, a Peltier device 404 is mounted. In the present embodiment, the bottom face of the wafer attracting surface 401 of the first constituent element $402_1$ provides a heat receiving surface, while the bottom face of the Peltier device 404 of the third constituent element $402_3$ provides a cooling surface.

As illustrated, the first constituent element $402_1$ is so constructed that it covers the whole of the wafer attracting surface 401b and that the back of the wafer attracting surface 401 is assuredly equipped with a wick. This ensures that the back of the wafer attracting surface 401 is surely cooled by the operative liquid 404 in the wick, and prevents insufficient cooling. Further, the operative liquid 404 is so contained in the container that it is positioned below the outer periphery of the wafer attracting surface 401, to thereby prevent insufficient cooling even in a case when the device is used in an upstanding type chuck, namely, a chuck in an exposure apparatus wherein a wafer is held by attraction so that the direction of projection of the exposure light intersects substantially perpendicularly to gravity. The heat pipe of the structure described above is supported by a wafer chuck supporting block 408. The cooling block 405 is attached to the Peltier device 404, and it is cooled by cooling water supplied to flow passageways 407 therein through piping means 407. The temperature of the Peltier device 404 is controlled by processing the output of a temperature sensor (not shown) through a controller (not shown) and by supplying a suitable electric current to the Peltier device 404 from a Peltier device controller (not shown).

Use of at least one temperature sensor and at least one Peltier device is sufficient in the present embodiment. This is because the temperature distribution of the heat pipe is substantially uniform, with the exception that the temperature is high at the heat receiving surface and is low at the cooling surface. In the example shown in FIG. 8, the temperature is uniform in the hatched area and, in any portion of this area, a temperature sensor may be mounted.

The present embodiment wherein the wafer attracting block provides a constituent element of a heat pipe, assures further simplification of structure as compared with the forgoing embodiments.

Figure 9:
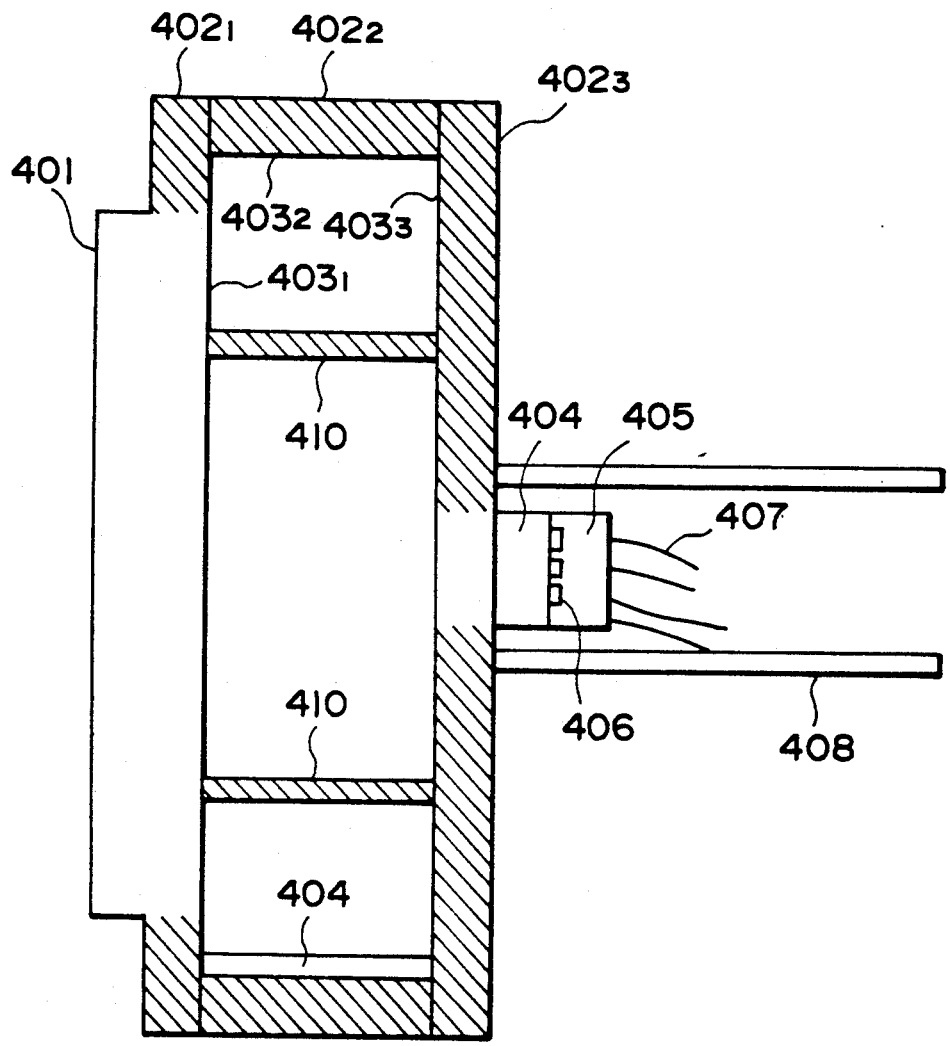
FIG. 9 is a sectional view showing an internal structure of a wafer chuck according to a sixth embodiment of the present invention.

FIG. 9 shows the structure of a sixth embodiment of the present invention.

In this embodiment, pillars 410 are disposed within a heat pipe which is provided by the constituent elements $402_1$–$402_3$ of the fifth embodiment. With the provision of these pillars 410, it is possible to prevent deformation of the heat pipe due to a differential pressure between the saturated vapor pressure of the operative liquid 404 in the heat pipe and the ambience pressure outside the heat pipe. In this embodiment, a temperature sensor may be mounted in the pillar 410.

Figure 10A:
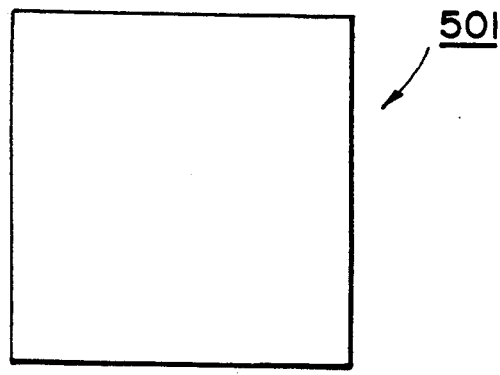
FIGS. 10A-10C are schematic illustrations for explaining examples of heat pipe division.
Figure 10B:
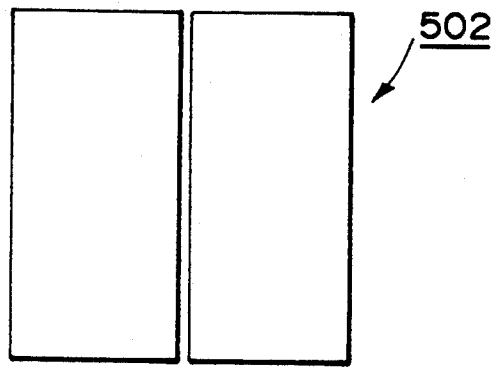
Figure 10C:
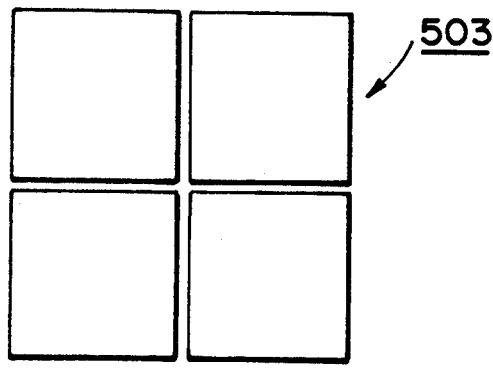

In some of the foregoing embodiments, the heat pipe has been described as being integral and as having a rectangular shape as viewed in the direction of impingement of the exposure light, like a heat pipe 501 shown in FIG. 10A. However, it may be divided into two (like the heat pipe structure 502 in FIG. 10B) or four (like the heat pipe structure 503 in FIG. 10C), and each divided heat pipe may be equipped with a temperature sensor and a Peltier device. Also, the shape is not limited to this. If the heat pipe is divided, the X-Y area of each divided part is small and, therefore, the supply of operative liquid can be quicker. Thus, the advantageous effects of the present invention can be enhanced further.

If the dividing of the heat pipe results in the presence of operative liquid within the exposure region (e.g. FIG. 10C case), an operative liquid reservoir may be provided outside the exposure region.

While the invention has been described with reference to the structures disclosed herein, it is not confined to the details set forth and this application is intended to cover such modifications or changes as may come within the purposes of the improvements or the scope of the following claims.

What is claimed is:

1. A substrate holding device, comprising:
   a chuck having an attracting surface for holding a substrate, an inside space and an inside heat pipe structure provided in the inside space, said heat pipe structure removing generated heat by evaporation of a liquid medium;
   a temperature controlling block having a structure that allows flow of a temperature controlling medium therethrough, said temperature controlling block being thermally coupled to said attracting surface of said chuck through said heat pipe structure; and
   a stage for moving said chuck and said temperature controlling block as a unit, and for supporting said chuck through said temperature controlling block.

2. A device according to claim 1, wherein said chuck has a plurality of independent heat pipe structures provided in the inside space.

3. A device according to claim 1, wherein the substrate comprises a semiconductor wafer.

4. A substrate holding device, comprising:
   a chuck having an attracting surface for holding a substrate, and extending substantially vertically, said chuck further having an inside space and a plurality of independent heat pipe structures provided in the inside space, said heat pipe structures removing generated heat by evaporation of a liquid medium;
   a temperature controlling block having a structure that allows flow of a temperature controlling medium therethrough, said temperature controlling block being thermally coupled to said attracting surface of said chuck through said heat pipe structures; and
   a stage for moving said chuck and said temperature controlling block as a unit.

5. A device according to claim 4, wherein said heat pipe structures are arrayed substantially along the vertical direction.

6. A device according to claim 4, wherein the substrate comprises a semiconductor wafer.

7. A substrate holding device, comprising:
a chuck having an attracting surface for holding a substrate for exposure of a zone of the substrate with a radiation beam, said chuck further having an inside space and an inside heat pipe structure provided in the inside space, wherein the heat pipe structure removes generated heat by evaporation of a liquid medium and said attracting surface has an area not smaller than that of the zone of the substrate;
a temperature controlling block having a structure that allows flow of a temperature controlling medium therethrough, said temperature controlling block being thermally coupled to said attracting surface of said chuck through said heat pipe structure; and
a stage for moving said chuck and said temperature controlling block as a unit.

8. A device according to claim 5, wherein a surface of the inside space of said chuck, on an opposite side of said attracting surface, has an area not smaller than that of said attracting surface.

9. A device according to claim 8, wherein said chuck has a plurality of independent heat pipe structures arrayed along said attracting surface.

10. A device according to claim 7, wherein the substrate comprises a semiconductor wafer.

11. A substrate holding device, comprising:
a chuck having an attracting surface for holding a substrate;
a heat pipe structure provided on a side of said chuck remote from said attracting surface, said heat pipe structure removing generated heat by evaporation of a liquid medium;
a Peltier device provided on the side of said chuck remote from said attracting surface;
a temperature controlling block having a structure that allows flow of a temperature controlling medium therethrough, said temperature controlling block being thermally coupled to said attracting surface of said chuck through said heat pipe structure and said Peltier device; and
a stage for moving said chuck and said temperature controlling block as a unit, and for supporting said chuck through said temperature controlling block.

12. A device according to claim 4, wherein a plurality of independent heat pipe structures are provided on the side of said chuck remote from said attracting surface.

13. A device according to claim 11, wherein the substrate comprises a semiconductor wafer.

14. A substrate holding device, comprising:
a chuck having an attracting surface for holding a substrate and extending substantially vertically;
a plurality of independent heat pipe structures provided on a side of said chuck remote from said attracting surface, said heat pipe structures removing generated heat by evaporation of a liquid medium;
a Peltier device provided on the side of said chuck remote from said attracting surface;
a temperature controlling block having a structure that allows flow of a temperature controlling medium therethrough, said temperature controlling block being thermally coupled to said attracting surface of said chuck through said heat pipe structures and said Peltier device; and
a stage for moving said chuck and said temperature controlling block as a unit.

15. A device according to claim 14, wherein said heat pipe structures are arrayed substantially along the vertical direction.

16. A device according to claim 14, wherein the substrate comprises a semiconductor wafer.

17. A substrate holding device, comprising:
a chuck having an attracting surface for holding a substrate for exposure of a zone of the substrate with a radiation beam, wherein said attracting surface has an area not smaller than that of the zone of the substrate;
a heat pipe structure provided on a side of said chuck remote from said attracting surface, said heat pipe structure removing generated heat by evaporation of a liquid medium;
a Peltier device provided on the side of said chuck remote from said attracting surface;
a temperature controlling block having a structure that allows flow of a temperature controlling medium therethrough, said temperature controlling block being thermally coupled to said attracting surface of said chuck through said heat pipe structure and said Peltier device; and
a stage for moving said chuck and said temperature controlling block as a unit.

18. A device according to claim 12, wherein a surface of said heat pipe structure surface opposed to said attracting surface of said chuck has an area not smaller than that of said attracting surface.

19. A device according to claim 17, wherein, on a side of said chuck remote from said attracting surface, a plurality of independent heat pipe structures are arrayed along said attracting surface.

20. A device according to claim 17, wherein the substrate comprises a semiconductor wafer.

* * * * *

UNITED STATES PATENT AND TRADEMARK OFFICE
CERTIFICATE OF CORRECTION

PATENT NO. : 5,220,171  
DATED : June 15, 1993  
INVENTOR(S) : Shinichi Hara, et al.

It is certified that error appears in the above-indentified patent and that said Letters Patent is hereby corrected as shown below:

ON THE COVER PAGE
Item [56] References Cited  
UNDER "U.S. PATENT DOCUMENTS"

the following should be inserted:

| | | | |
|---|---|---|---|
| --4,062,462 | 12/1977 | Hentz, et al. | 214/152 |
| 4,508,161 | 4/1985 | Holden | 165/1 |
| 4,607,166 | 8/1986 | Tamaki | 250/442.1 |
| 4,969,168 | 11/1990 | Sakamoto, et al. | 378/34 |
| 5,063,582 | 11/1991 | Mori, et al. | 378/34 |

FOREIGN PATENT DOCUMENTS

| | | |
|---|---|---|
| 58-096992 | 6/1983 | Japan |
| 59-117128 | 7/1984 | Japan |
| 61-172357 | 8/1986 | Japan |
| 63-065066 | 3/1988 | Japan |
| 63-098119 | 4/1988 | Japan |
| 63-193447 | 8/1988 | Japan |
| 02-100311 | 4/1990 | Japan |
| 02-183514 | 7/1990 | Japan--. |

UNITED STATES PATENT AND TRADEMARK OFFICE
CERTIFICATE OF CORRECTION

PATENT NO. : 5,220,171  
DATED : June 15, 1993  
INVENTOR(S) : Shinichi Hara, et al.

It is certified that error appears in the above-indentified patent and that said Letters Patent is hereby corrected as shown below:

COLUMN 3

Line 2, "sponsibility" should read --sponse--; and  
    Line 64, "angle)." should read --angle)".--.

COLUMN 4

Line 6, "filed" should read --field--.

COLUMN 7

Line 22, "A1" should read --Al--;  
    Line 33, "$4_1$-$4_7$." should read --$4_1$-$4_7$,--; and  
    Line 41, "to" should be deleted.

COLUMN 9

Line 23, "$24_1$-$24_7$." should read --$24_1$-$24_7$,--.

UNITED STATES PATENT AND TRADEMARK OFFICE
CERTIFICATE OF CORRECTION

PATENT NO. : 5,220,171
DATED : June 15, 1993
INVENTOR(S) : Shinichi Hara, et al.

It is certified that error appears in the above-indentified patent and that said Letters Patent is hereby corrected as shown below:

COLUMN 11

Line 2, "theses" should read --these--; and
    Line 6, "(1f6)" should be deleted.

COLUMN 15

Line 21, "claim 5," should read --claim 7,--; and
    Line 48, "claim 4," should read --claims 11,--.

Signed and Sealed this

Fifth Day of April, 1994

BRUCE LEHMAN

*Attest:*

*Attesting Officer*  *Commissioner of Patents and Trademarks*